US011385672B1

(12) United States Patent
Chu

(10) Patent No.: US 11,385,672 B1
(45) Date of Patent: Jul. 12, 2022

(54) FINGER POINTING JOYSTICK WITH MAGNETIC INDUCTION

(71) Applicant: Ching-Hsiung Chu, New Taipei (TW)

(72) Inventor: Ching-Hsiung Chu, New Taipei (TW)

(73) Assignee: Ching-Hsiung Chu, New Taipei (TW)

( * ) Notice: Subject to any disclaimer, the term of this patent is extended or adjusted under 35 U.S.C. 154(b) by 0 days.

(21) Appl. No.: 16/845,091

(22) Filed: Apr. 10, 2020

(51) Int. Cl.

| | |
|---|---|
| ***G05G 9/047*** | (2006.01) |
| ***H03K 17/94*** | (2006.01) |
| ***H03M 11/00*** | (2006.01) |
| ***H01F 27/40*** | (2006.01) |
| ***G05G 25/00*** | (2006.01) |
| ***G05G 5/05*** | (2006.01) |

(52) U.S. Cl.
CPC ............... *G05G 9/047* (2013.01); *G05G 5/05* (2013.01); *G05G 25/00* (2013.01); *H01F 27/40* (2013.01); *G05G 2009/04755* (2013.01); *G05G 2505/00* (2013.01)

(58) Field of Classification Search
CPC .......... G05G 9/047; G05G 25/00; G05G 5/05; G05G 2505/00; G05G 2009/04755; H01F 27/40
See application file for complete search history.

(56) References Cited

U.S. PATENT DOCUMENTS 6,992,602 B2 * 1/2006 Alexander ............. G05G 9/047 318/560
2004/0130530 A1 * 7/2004 Gustafsson .............. G05G 5/28 345/161
2016/0306379 A1 * 10/2016 Zils .......................... G05G 1/04
2019/0366843 A1 * 12/2019 Mizukami ............. G05G 9/047

FOREIGN PATENT DOCUMENTS

EP 1310854 A1 * 5/2003

* cited by examiner

*Primary Examiner* — Vinh Luong

(57) ABSTRACT

A finger pointing joystick with magnetic induction is provided. The finger pointing joystick with magnetic induction includes a main housing having a bottom case and an upper cover; a support frame having a fixed end fixedly to an end of the bottom case; a movable sphere disposed on a receiving ring; a joystick body fixed on the movable sphere; an elastic piston piece having a connecting rod inserted through a piston groove, an elastic disc fixed below the connecting rod, a return spring fixed between the movable sphere and the elastic disc, and a magnet correspondingly fixed to the elastic disk; and a magnetic induction element disposed below the magnet.

4 Claims, 5 Drawing Sheets

FINGER POINTING JOYSTICK WITH MAGNETIC INDUCTION

FIELD OF INVENTION

The present invention relates to a finger pointing joystick with magnetic induction, and in particular, to a small joystick for magnetic thumb control.

BACKGROUND OF INVENTION

On a variety of electronic products, it is often seen that a joystick-type controller is used as a means of operation. There are many specifications, sizes and types of joysticks, and application ranges of the joysticks are quite wide.

Common joysticks in the prior art are mainly joysticks operated by hand holding. There is another type of the joysticks with a small size, which is mainly controlled by fingering. In this type of finger-type joystick mechanism, it mainly uses a contact mechanism in each direction of the joystick to further generate a signal through a form of impact during actions to determine directions of movement of the joystick. However, such joystick has disadvantage of being easily worn out due to long-term use.

Therefore, in view of the foregoing, inventors of the present invention have considered and designed a finger pointing joystick with magnetic induction, in order to improve lacks of current technologies, thereby enhancing implementation and utilization in the industry.

TECHNICAL SOLUTION

In view of aforesaid shortcomings of the prior art, the present invention is to design a finger pointing joystick with magnetic induction with patent elements such as novelty, inventive step, and industrial applicability, in order to overcome difficulties of the prior art.

In order to achieve the above objective, technical means adopted in the present invention is to design a finger pointing joystick with magnetic induction comprising a main housing comprising a bottom case and an upper cover, wherein an opening is provided above the bottom case, a container is disposed in the opening, and a fixing portion is disposed on a side of the bottom case, wherein the upper cover corresponds to the opening of the bottom case in a closed manner, a via hole is provided on an upper side of the upper cover, and an outer wall surface of the upper cover is concavely provided with an annular groove surrounding the via hole; a support frame comprising a fixed end, a receiving ring, and an active end, wherein the fixed end is fixedly corresponding to the fixing portion of the bottom case, the receiving ring is connected to the fixed end and is disposed under the via hole, the active end is connected to a side of the receiving ring, and the active end extends downward to form a pressing rod; a movable sphere correspondingly disposed between the receiving ring and the via hole of the upper cover, and the movable sphere freely rotated therein, wherein a piston groove is disposed below the movable sphere, and a fixed groove is disposed above the movable sphere; a joystick body detachably fixed to the fixed groove of the movable sphere, wherein the joystick body can be moved corresponding to a thumb of a human body to drive the movable sphere to rotate, and the thumb of the human body can be pressed downward to push the movable sphere and the active end connected to the receiving ring downwardly; a pressing signal device correspondingly disposed in the main housing and correspondingly disposed below the pressing rod, wherein the pressing signal device can be pressed by the pressing rod to output a driving signal indicating a pressing; an elastic piston piece comprising a connecting rod, an elastic disc, a return spring, and a magnet, wherein the connecting rod is correspondingly inserted through the piston groove of the movable sphere, and can be moved up and down in the piston groove; the elastic disk is fixed below the connecting rod and rests on a bottom wall of the bottom case, and a recessed groove is disposed on a lower side of the elastic disk; two ends of the return spring are respectively fixed to the movable sphere and the elastic disc; and the magnet is correspondingly fixed to the recessed groove; and a magnetic induction element correspondingly disposed on a lower side of the bottom case and corresponds to a lower side of the magnet, wherein the magnetic induction element determines a rotation direction of the movable sphere by sensing a change of a magnetic force of the magnet, and outputs a driving signal indicating the rotation direction.

Wherein, the finger pointing joystick with magnetic induction further comprises an indicator module corresponding to the annular groove disposed on the upper cover.

Wherein, the indicator module comprises a ring light board, and the ring light board is provided with a plurality of LED lamps at least representing up, down, left, and right directions.

Wherein, a cover can be further provided on the ring lamp board.

The design of the finger pointing joystick with magnetic induction of the present invention is mainly based on a design of the magnetic induction mechanism, and then achieves advantages of stable signal and high service life in the small joystick controlled by thumb, which is beyond the reach of the prior art.

DETAILED DESCRIPTION OF PREFERRED EMBODIMENTS

Figure 1:
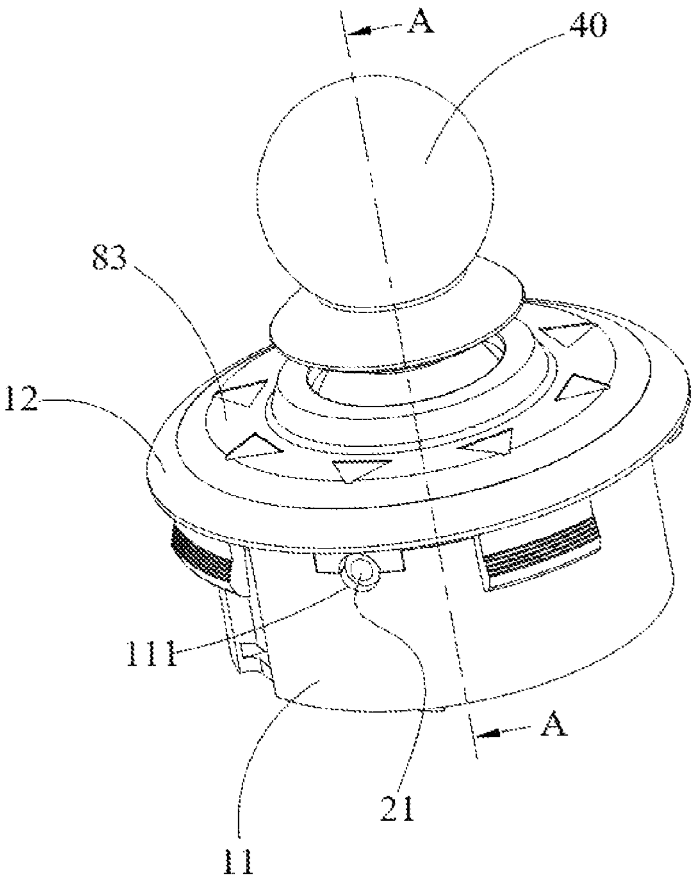
FIG. 1 is a schematic view of a finger pointing joystick with magnetic induction according to the present invention.
Figure 2:
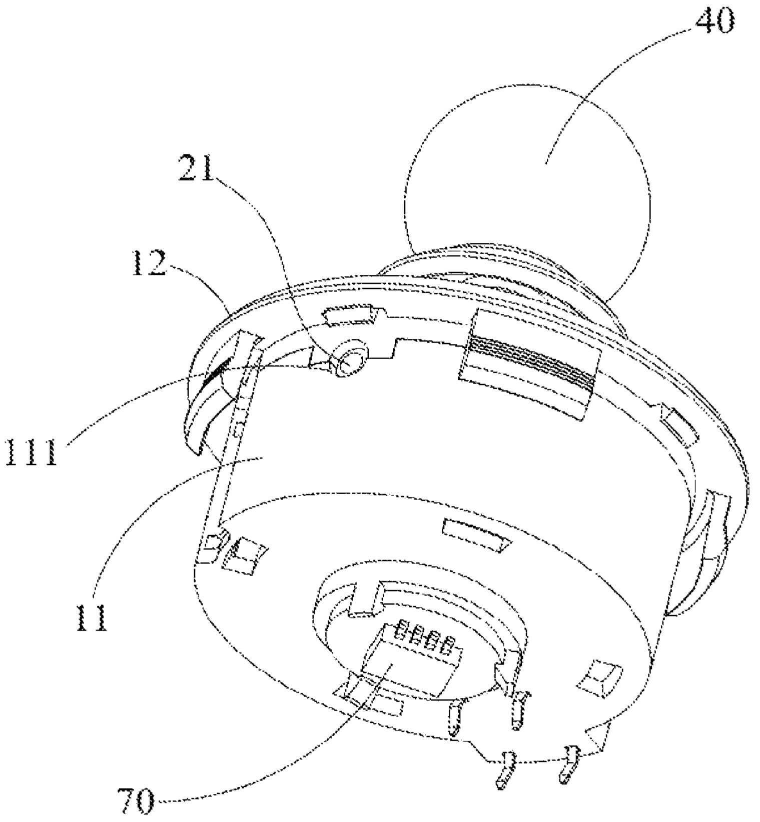
FIG. 2 is another schematic view of the finger pointing joystick with magnetic induction of the present invention.
Figure 3:
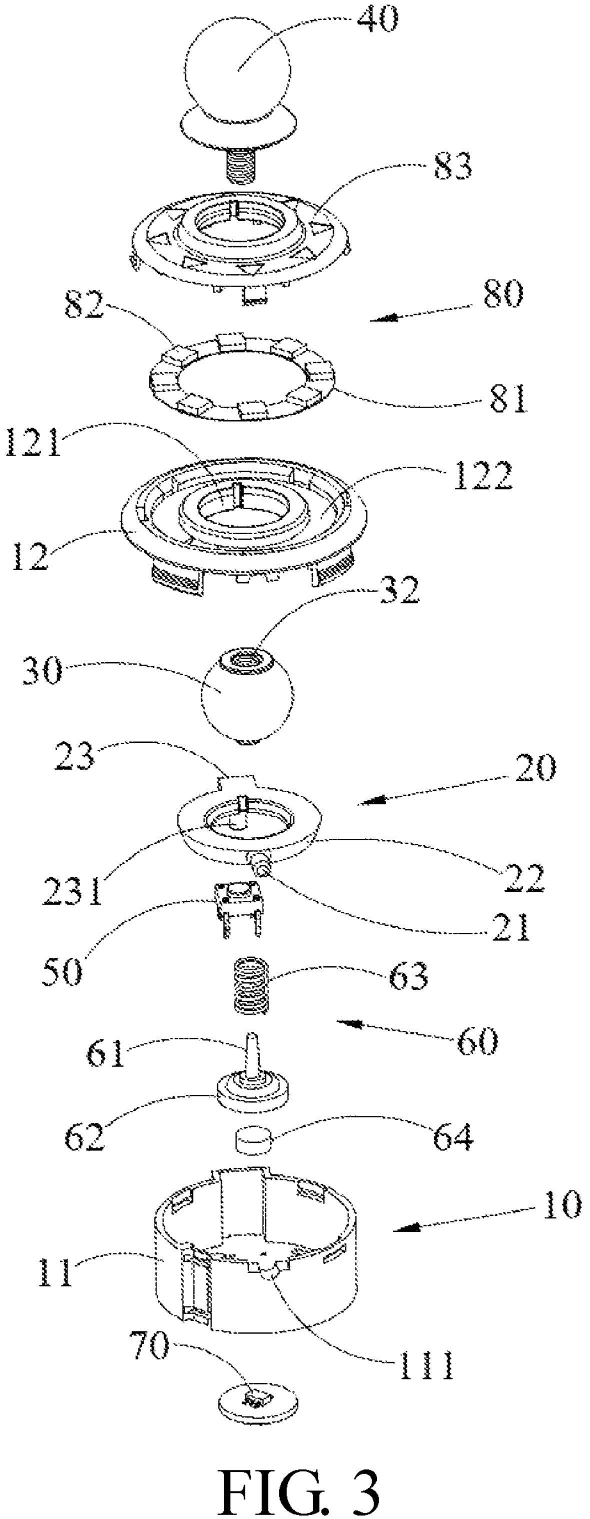
FIG. 3 is an exploded view of the finger pointing joystick with magnetic induction of the present invention.
Figure 4:
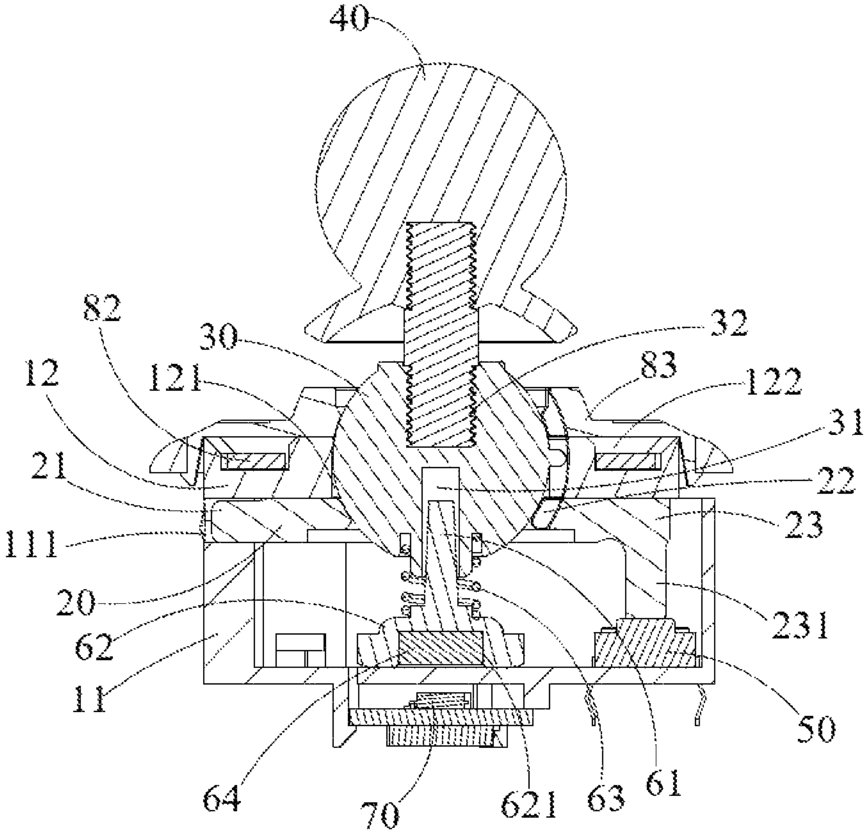
FIG. 4 is a cross-sectional view of line A-A in FIG. 1.
Figure 5:
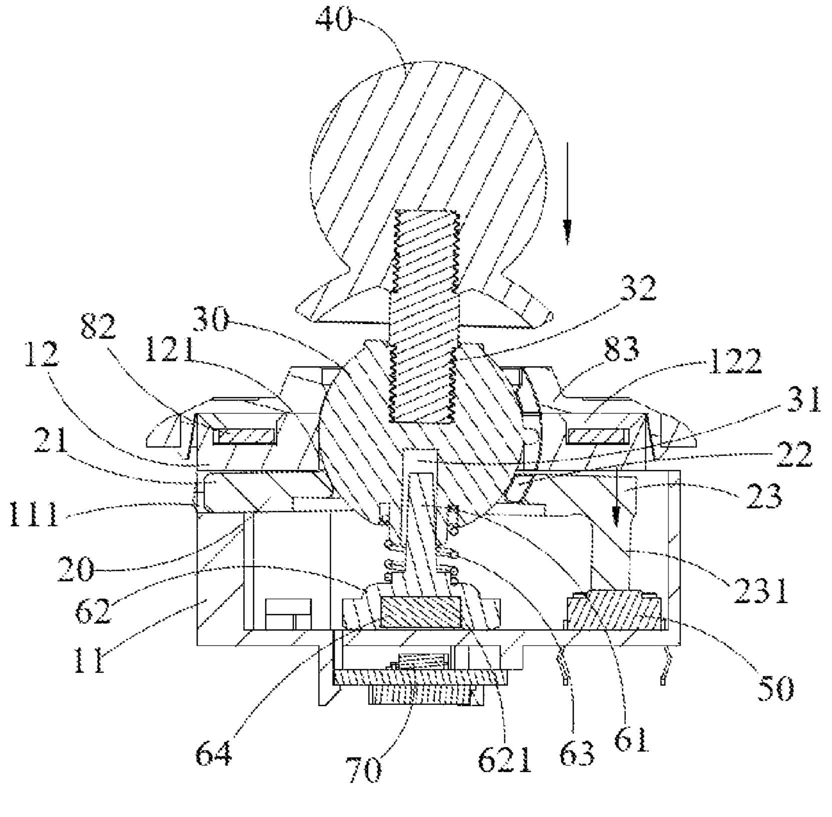
FIG. 5 is a cross-sectional view of line A-A of an embodiment in FIG. 1.

Please refer to FIG. 1 to FIG. 5, the present invention relates to a finger pointing joystick with magnetic induction. The finger pointing joystick with magnetic induction comprises a main housing 10, a support frame 20, a movable sphere 30, a joystick body 40, a pressing signal device 50, an elastic piston piece 60, a magnetic induction element 70, and an indicator module 80.

The main housing 10 comprises a bottom case 11 and an upper cover 12, wherein an opening 110 is provided above the bottom case 11, a container is disposed in the opening 110, and a fixing portion 111 is disposed on a side of the bottom case 11. The upper cover 12 corresponds to the opening 110 of the bottom case 11 in a closed manner. A via hole 121 is provided on an upper side of the upper cover 12, and an outer wall surface of the upper cover 12 is concavely provided with an annular groove 122 surrounding the via hole 121.

The support frame 20 comprises a fixed end 21, a receiving ring 22, and an active end 23, wherein the fixed end 21 is fixedly corresponding to the fixing portion 111 of the bottom case 11, the receiving ring 22 is connected to the fixed end 21 and is disposed under the via hole 121, the active end 23 is connected to a side of the receiving ring 22, and the active end 23 extends downward to form a pressing rod 231.

The movable sphere 30 is correspondingly disposed between the receiving ring 22 and the via hole 121 of the upper cover 12, and the movable sphere 30 is freely rotated therein. A piston groove 31 is disposed below the movable sphere 30, and a fixed groove 32 is disposed above the movable sphere 30.

The joystick body 40 is detachably fixed to the fixed groove 32 of the movable sphere 30, wherein the joystick body 40 can be moved corresponding to a thumb of a human body to drive the movable sphere 30 to rotate, and the thumb of the human body can be pressed downward to push the movable sphere 30 and the active end 23 connected to the receiving ring 22 downwardly.

The pressing signal device 50 is correspondingly disposed in the main housing 10 and correspondingly disposed below the pressing rod 231.

When the active end 23 is moved downward, pressing signal device 50 can be pressed by the pressing rod 231 of the active end 23, and a driving signal indicating the pressing can be output.

The elastic piston piece 60 comprises a connecting rod 61, an elastic disc 62, a return spring 63, and a magnet 64. The connecting rod 61 is correspondingly inserted through the piston groove 31 of the movable sphere 30, and can be moved up and down in the piston groove 31. The elastic disk 62 is fixed below the connecting rod 61 and rests on a bottom wall of the bottom case 11, and a recessed groove 621 is disposed on a lower side of the elastic disk 62. Two ends of the return spring 63 are respectively fixed to the movable sphere 30 and the elastic disc 62. After the movable sphere 30 is moved downward or rotated, the return spring 63 can provide a reset elastic return force. The magnet 64 is correspondingly fixed to the recessed groove 621.

The magnetic induction element 70 is correspondingly disposed on a lower side of the bottom case 11 and corresponds to a lower side of the magnet 64. The magnetic induction element 70 determines a rotation direction of the movable sphere 30 by sensing a change of a magnetic force of the magnet 64, and outputs a driving signal indicating the rotation direction.

The indicator module 80 is correspondingly disposed in the annular groove 122 disposed on the upper cover 12. The indicator module 80 comprises a ring light board 81, the ring light board 81 is provided with a plurality of LED lamps 82 at least representing up, down, left, and right directions, and a cover 83 can be further provided on the ring light board 81.

The design of the finger pointing joystick with magnetic induction of the present invention is mainly based on a design of the magnetic induction mechanism, and then achieves advantages of stable signal and high service life in the small joystick controlled by thumb, which is beyond the reach of the prior art.

REFERENCE NUMERALS

10: main housing
11: bottom case
111: fixing portion
12: upper cover
121: via hole
122: annular groove
20: support frame
21: fixed end
22: receiving ring
23: active end
231: pressing rod
30: movable sphere
31: piston groove
32: fixed groove
40: joystick body
50: pressing signal device
60: elastic piston piece
61: connecting rod
62: elastic disc
621: recessed groove
63: return spring
64: magnet
70: magnetic induction element
80: indicator module
81: ring light board
82: LED lamp
83: cover

What is claimed is:

1. A finger pointing joystick with magnetic induction, comprising:

a main housing comprising a bottom case and an upper cover, wherein an opening is provided above the bottom case, and a fixing portion is disposed on a side of the bottom case, wherein the upper cover corresponds to the opening of the bottom case in a closed manner, a via hole is provided on an upper side of the upper cover, and an outer wall surface of the upper cover is concavely provided with an annular groove surrounding the via hole;

a support frame comprising a fixed end, a receiving ring, and an active end, wherein the fixed end is fixedly corresponding to the fixing portion of the bottom case, the receiving ring is connected to the fixed end and is disposed under the via hole, the active end is connected to a side of the receiving ring, and the active end extends downward to form a pressing rod;

a movable sphere correspondingly disposed between the receiving ring and the via hole of the upper cover, and the movable sphere freely rotated therein, wherein a piston groove is disposed below the movable sphere, and a fixed groove is disposed above the movable sphere;

a joystick body detachably fixed to the fixed groove of the movable sphere, wherein the joystick body can be moved corresponding to a thumb of a human body to drive the movable sphere to rotate, and the thumb of the human body can be pressed downward to push the movable sphere and the active end connected to the receiving ring downwardly;

a pressing signal device correspondingly disposed in the main housing and correspondingly disposed below the pressing rod, wherein the pressing signal device can be pressed by the pressing rod to output a driving signal indicating a pressing;

an elastic piston piece comprising a connecting rod, an elastic disc, a return spring, and a magnet, wherein the connecting rod is correspondingly inserted through the piston groove of the movable sphere, and can be moved up and down in the piston groove; the elastic disk is fixed below the connecting rod and rests on a bottom wall of the bottom case, and a recessed groove is disposed on a lower side of the elastic disk; two ends of the return spring are respectively fixed to the movable sphere and the elastic disc; and the magnet is correspondingly fixed to the recessed groove; and a magnetic induction element correspondingly disposed on a lower side of the bottom case and corresponds to a lower side of the magnet, wherein the magnetic induction element determines a rotation direction of the movable sphere by sensing a change of a magnetic force of the magnet, and outputs a driving signal indicating the rotation direction.

2. The finger pointing joystick with the magnetic induction as claimed in claim 1, further comprising an indicator module corresponding to the annular groove disposed on the upper cover.

3. The finger pointing joystick with the magnetic induction as claimed in claim 2, wherein the indicator module comprises a ring light board, and the ring light board is provided with a plurality of LED lamps at least representing up, down, left and right directions.

4. The finger pointing joystick with the magnetic induction as claimed in claim 3, wherein a cover can be further provided on the ring light board.

* * * * *